(12) United States Patent
Essert et al.

(10) Patent No.: US 8,134,838 B2
(45) Date of Patent: Mar. 13, 2012

(54) SEMICONDUCTOR MODULE AND METHOD

(75) Inventors: Mark Essert, Lippstadt (DE); Martin Knecht, Erwitte (DE); Alexander Ciliox, Moehnsee (DE)

(73) Assignee: Infineon Technologies AG, Neubiberg (DE)

( * ) Notice: Subject to any disclaimer, the term of this patent is extended or adjusted under 35 U.S.C. 154(b) by 895 days.

(21) Appl. No.: 12/176,731

(22) Filed: Jul. 21, 2008

(65) Prior Publication Data
US 2010/0014269 A1    Jan. 21, 2010

(51) Int. Cl.
*H05K 7/14* (2006.01)
(52) U.S. Cl. ......... 361/730; 361/728; 361/809; 174/520
(58) Field of Classification Search .................. 361/728, 361/730, 808, 809; 174/520; 257/678
See application file for complete search history.

(56) References Cited

U.S. PATENT DOCUMENTS

| | | | | | |
|---|---|---|---|---|---|
| 5,753,971 | A | * | 5/1998 | Miller et al. | 257/690 |
| 5,920,119 | A | * | 7/1999 | Tamba et al. | 257/718 |
| 6,396,125 | B1 | * | 5/2002 | Soyano | 257/565 |
| 6,521,983 | B1 | * | 2/2003 | Yoshimatsu et al. | 257/678 |
| 7,147,520 | B2 | | 12/2006 | Lokietz | |
| 7,445,519 | B2 | * | 11/2008 | Matsumoto | 439/709 |
| 7,848,112 | B2 | * | 12/2010 | Matsumoto | 361/730 |
| 2008/0142948 | A1 | * | 6/2008 | Matsumoto | 257/690 |

FOREIGN PATENT DOCUMENTS

DE                19719703 C5    11/2005

\* cited by examiner

*Primary Examiner* — Dameon Levi
(74) *Attorney, Agent, or Firm* — Dicke, Billig & Czaja, PLLC

(57) ABSTRACT

A semiconductor module and a method. One embodiment provides a housing with a housing frame and a pluggable carrier which is plugged in the housing frame. The pluggable carrier is equipped with a lead which includes an internal portion which is arranged inside the housing, and an external portion which is arranged outside the housing. The internal portion is electrically coupled to an electric component of the power semiconductor module. The external portion allows for electrically coupling the power semiconductor module.

19 Claims, 2 Drawing Sheets

SEMICONDUCTOR MODULE AND METHOD

BACKGROUND

One aspect relates to power semiconductor modules, and to a method for producing a power semiconductor module.

Conventional power semiconductor modules include a housing with guide rails, in which electrical leads for electrically connecting the module to other devices are inserted. In other conventional modules, the electrical leads are cast integral with the housing. In still other modules, the electrical leads are pushed through an opening of the housing and the mechanical fixing is substantially effected by soldering the leads to a power semiconductor chip or to a metallization of a circuit carrier.

As the layout of the electrical circuits inside the housing depends on the type of module, different types of modules typically require individually configured housings.

Hence, there is a need for improved power semiconductor modules and for a method for producing improved power semiconductor modules.

SUMMARY

A semiconductor module is provided. One embodiment provides a housing with a housing frame and a pluggable carrier which is plugged in the housing frame. The pluggable carrier is equipped with a lead which includes an internal portion which is arranged inside the housing, and an external portion which is arranged outside the housing. The internal portion is electrically connected to an electric component of the semiconductor module. The external portion allows for electrically connecting the semiconductor module.

In one embodiment, a semiconductor module includes a housing with a housing frame, a connecting means for electrically connecting the semiconductor module, and a carrying means for carrying the connecting means. The connecting means is plugged in a slot of the housing frame.

In one embodiment, a power semiconductor module includes a pluggable carrier, a lead which is partly inserted into a depression of the pluggable carrier, and a housing with a housing frame. The housing frame includes at least one slot, wherein each of the slots is designed to receive the pluggable carrier, and wherein the pluggable carrier is plugged in one of the slots. The lead includes an internal portion which is arranged inside the housing and an external portion which is arranged outside the housing. The internal portion is electrically connected to an electric component of the power semiconductor module. The external portion allows for electrically connecting the power semiconductor module.

In a method for producing a power semiconductor module a pluggable carrier, a lead with a first section and with a second section, a housing with a housing frame, and an electric component are provided. The housing frame includes at least one slot which is designed to receive the pluggable carrier. The method further includes the processes of equipping the pluggable carrier with the lead, of arranging the electric component inside the housing frame, of plugging the pluggable carrier in one of the slots, and of producing a material locking connection between the second section of the lead and the electric component.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 2 illustrates a perspective cut-away view of a power semiconductor module which includes a housing frame with slots, wherein in some of the slots pluggable carriers as illustrated in FIG. 1 are plugged in.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In one embodiment, in the method for producing a power semiconductor module the method processes may be executed in any order, unless otherwise mentioned and/or unless there is a technical requirement for certain processes to be executed prior to other processes.

Figure 1:
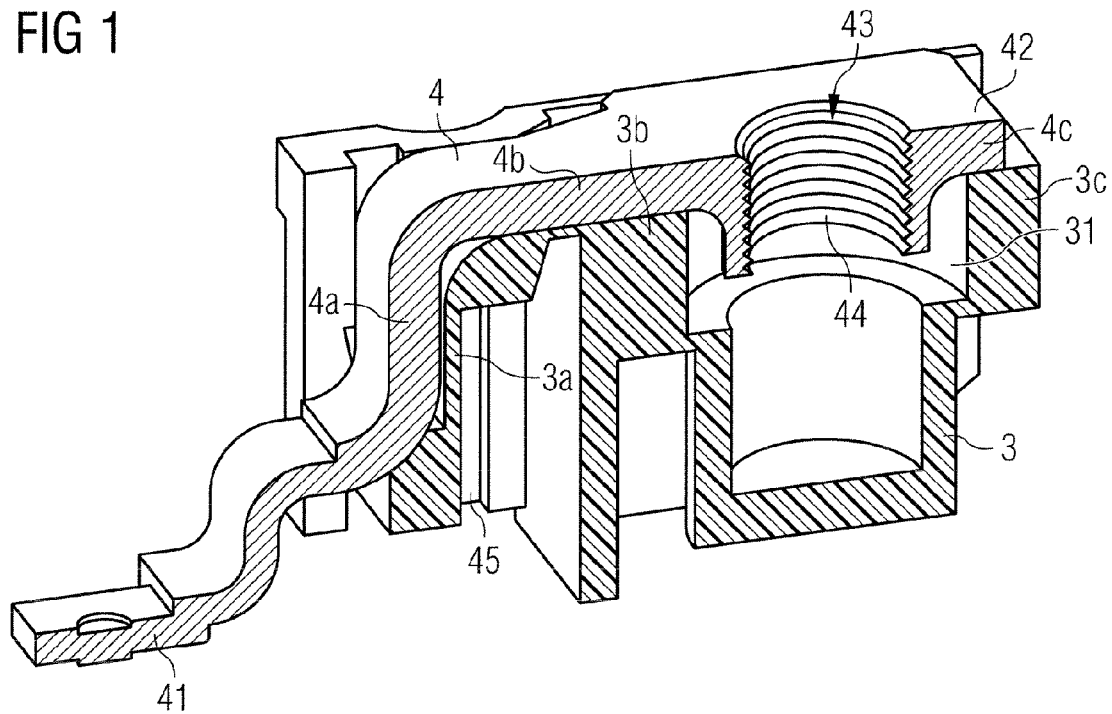
FIG. 1 illustrates a perspective schematic view illustrating one embodiment of a pluggable carrier which is equipped with a lead.

FIG. 1 illustrates a pluggable carrier 3 which is equipped with an electrical lead 4. The pluggable carrier 3 may be electrically insulating and, e.g., be made of plastics or of ceramics, or include plastics and/or ceramics. The electrical lead 4 is pushed in a receiving area, e.g., a depression, of the pluggable carrier 3. The receiving area, which may include sub-areas 3a, 3b, 3c spaced distant from one another, may be formed to fit with corresponding sections 4a, 4b, 4c of the electrical lead 4, i.e. in the sections 4a, 4b, 4c, the lead 4 touches the pluggable carrier 3 in the sub-areas.

To avoid detaching the lead 4 itself from the pluggable carrier 3, the lead 4 may optionally be pressed or snapped into the pluggable carrier 3. Another option is to mold the lead 4 partly in the pluggable carrier 3.

The lead 4, which may be made of or include low-ohmic material, e.g., copper, aluminum, or the like, includes an internal portion 41 which is to be arranged inside a housing of a power semiconductor module, and an external portion 42 which is to be arranged outside the housing. As illustrated in FIG. 1, the internal portion 41 and/or the external portion 42 in each case may be located at an end of the lead 4.

The internal portion 41 is intended to be electrically connected to an electrical component which is arranged inside the housing or inside the housing frame of the module. The external portion 42 allows for connecting the power semiconductor module to other components, e.g., to another power semiconductor modules, to a power supply, to a DC link capacitor, or to a device, for instance a motor, which shall be driven by the power semiconductor module. As a conductor line for externally connecting the power semiconductor module to another external component, e.g., bus bars or flat conductors like strip lines may be used.

For example, the connection between such a conductor line and the external portion 42 may be a screw joint, a plug-and-socket connection, a press-fit connection, or a soldered connection. In the example of FIG. 1, the external portion 42 of the lead 4 is provided with an opening 43 which optionally may include an internal thread 44. Instead of an internal thread 44, just the opening 43 may be provided to receive the end of a screw. In this case, the pluggable carrier 3 may include a cage 31 for receiving and fixing a screw nut underneath the opening 43, i.e. between the opening 43 and the pluggable carrier 3.

The pluggable carrier 3 includes a guide rail 45 which enables the pluggable carrier 3 to be plugged in a slot 2 of a housing frame of the module.

Figure 2:
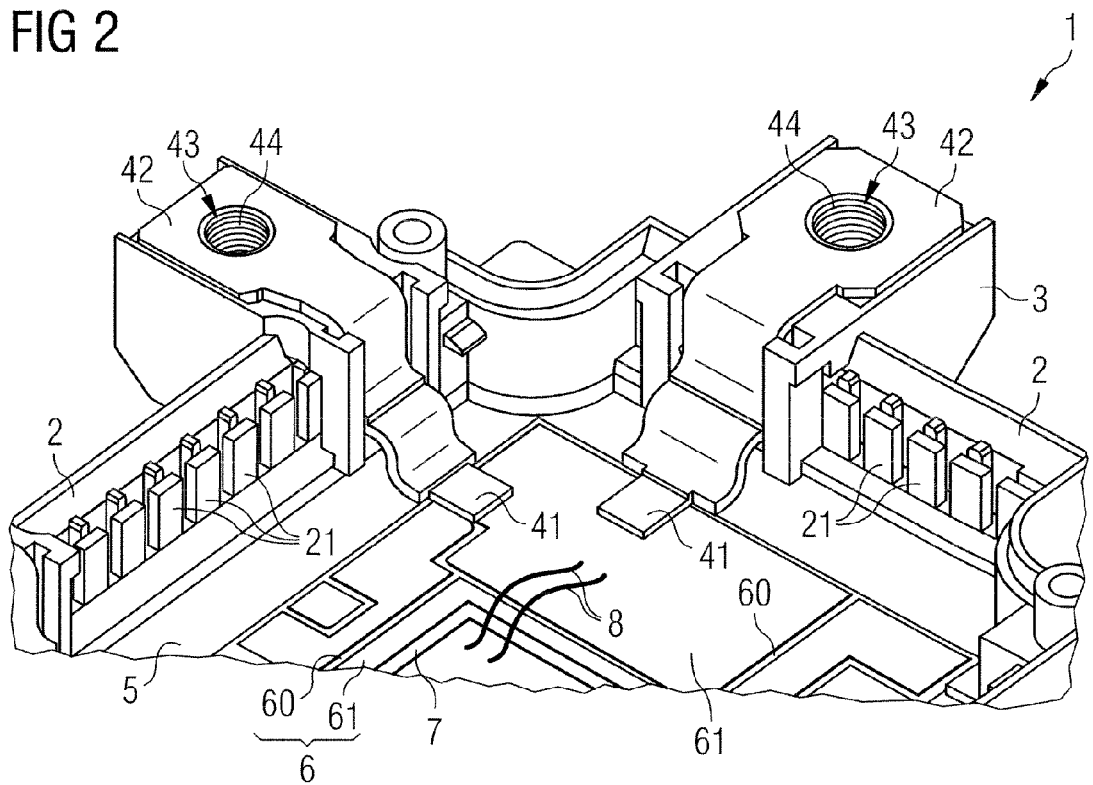

FIG. 2 illustrates a power semiconductor module 1 with a housing frame 2. The housing frame 2 runs around one or more electric components of the module 1, e.g., around a metallic base plate 5, a substrate 6, or a power semiconductor chip 7. In the example of FIG. 2, the housing of the power semiconductor module 1 includes the housing frame 2, and the base plate 5 which is arranged at the bottom side of the housing frame 2. The housing may include a housing cover which is arranged, opposite the bottom side, on the top side of the housing frame. In FIG. 2, the housing cover is removed.

On the top side of the base plate 5 one or more substrates, each including a dielectric layer 60 and a top metallization 61, may be arranged. The top metallizations 61 may be patterned to provide conductor paths and/or conductor pads. Depending on the layout of the module 1, the top metallization 61 of substrates may be equipped with power semiconductor chips 7, which may be electrically connected, e.g., by use of bonding wires 8, to separate sections of the top metallization 61, or to other components of the module 1.

The housing frame 2 includes at least one, in FIG. 2 a number of slots 21 which are designed to receive pluggable carriers 3 such as illustrated in FIG. 1, i.e. the slots 21 match with the guide rail 45. As the housing frame 2 may include a number of slots 21, the same type of housing frame 2 may be used together with different layouts of the module 1, in one embodiment with different patterns of the top metallization 61 and/or with differently equipped top metallizations 61. In general, it is not required to equip all slots 21 with a pluggable carrier 3, at least one of the slots may be unused.

In FIG. 2, the internal portions 41 are electrically connected to the top metallization 61. In one embodiment, not illustrated in FIG. 2, it is possible to electrically connect an internal portion 41 of a lead 4 to the top side of a power semiconductor chip 7. The electrical connection between an internal portion 41 on the one hand and the top metallization or a power semiconductor chip 7 on the other hand may be realized by at least one substance-to-substance, material locking bond, e.g., by ultrasonic bonding, soldering, welding, in one embodiment laser welding, or electrically conductive gluing.

When assembling the module 1, a lead 4 may be attached to the pluggable carrier 3 prior to or after plugging the pluggable carrier 3 in one of the slots 21. For example, the housing frame 2 of a module 1 to be assembled may be completely equipped with all required pluggable carriers 3 and then be attached to a base plate 5 which is equipped with at least one substrate and at least one power semiconductor chip 7. After attaching, the internal portions 41 may be electrically connected to a respective top metallization 61 or to the top side of a respective power semiconductor chip 7 by forming a substance-to-substance bond as described above.

However, when assembling a power semiconductor module of the present invention, the order of the assembling processes may differ from the order described above. For example, one, some or all pluggable carriers 3 of a module 1 may be plugged in the housing frame 2 without the respective leads 4 being attached. Inserting the leads 4 may be executed in one or more later processes. Of course, one, some or all pluggable carriers 3 of a module 1 may be equipped with the respective leads 4 prior to plugging the equipped carriers 3 in the housing frame 2.

As different electrical connections of a module 1 may require leads 4 with different ampacity, different leads 4 may have different sizes and/or different cross sections. For instance, a control input or a control output of the module 1 will require a lower ampacity than a power supply input or a power supply output. In cases where at least some of the leads 4 require large widths, a respective pluggable carrier 3 may include two or more guide rails 45 (see FIG. 1) so as to be plugged in a respective number of slots 21 of the housing frame 2.

In the example of FIG. 2, the slots 21 are arranged in sub-groups along different sides of the housing frame 2. Within each of the sub-groups, the slots 21 are arranged equally spaced with a pre-defined spacing, e.g., 2.54 mm.

Figure 3:
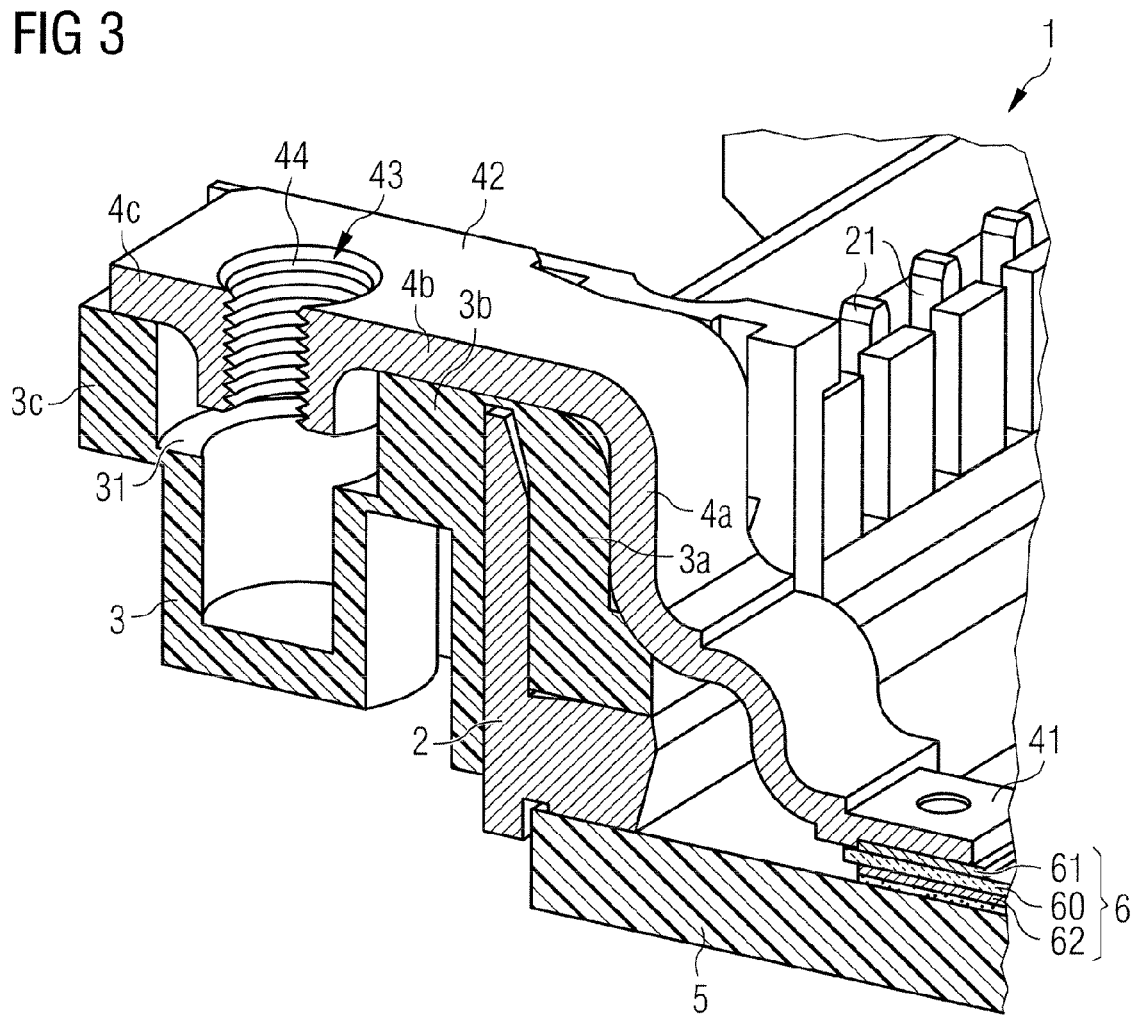
FIG. 3 illustrates a perspective cut-away view of a pluggable carrier as illustrated in FIG. 1, which is plugged in the slot of a housing frame.

FIG. 3 is a perspective cut-away view of a pluggable carrier 3 which is plugged in the slot of a housing frame 2 of a power semiconductor module 1. The module 1 may be designed as the module 1 of FIG. 2. In one embodiment, this view illustrates that the base plate 5 may be attached to the bottom of the housing frame 2 in order to form the bottom of a housing of the module 1.

FIG. 3 also illustrates, as an example, one possible configuration of a substrate 6. The substrate 6 includes a ceramic layer 60, e.g., of aluminum oxide, aluminum nitride, a patterned top metallization 61, and an optional bottom metallization 62. For instance, the substrate 6 may be a DCB-substrate (DCB=direct copper bonding) or an AMB-substrate (AMB=active metal brazing).

Between the internal portion 41 of the lead 4 and the top metallization 61a substance-to-substance bond has been formed by directly, i.e. without inserting additional material, bonding the internal portion 41 to the top metallization 61. When forming such a bonding connection, the internal portion 41 is pressed against the top metallization 61 by the tip of a bond head, wherein the tip, at the same time, oscillates—induced by an ultrasonic signal—in a direction parallel to the surface of the top metallization 61. In the same way, a substance-to-substance bond between an internal portion 41 of a lead 4 and a top side metallization of a power semiconductor chip 7 may be produced.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor module comprising:
    a housing with a housing frame; and
    a pluggable carrier configured with a lead;
    wherein the lead comprises an internal portion arranged inside the housing and electrically coupled to an electrical component of the semiconductor module;
    wherein the lead comprises an external portion arranged outside the housing and allows for electrically coupling the semiconductor module, the external portion made of one piece and comprising an internal thread; and
    wherein the pluggable carrier is plugged in the housing frame.

2. The semiconductor module of claim 1, wherein the lead is inserted at least partly into a first depression of the pluggable carrier.

3. The semiconductor module of claim 1, wherein the lead is molded partly in the pluggable carrier.

4. The semiconductor module of claim 1, wherein the carrier comprises plastics or is made of plastics, or wherein the carrier comprises ceramics or is made of ceramics.

5. The semiconductor module of claim 1, wherein the pluggable carrier is electrically insulating.

6. The semiconductor module of claim 1, wherein the housing frame comprises a number of slots, each of the slots being designed to receive the pluggable carrier.

7. The semiconductor module of claim 6, wherein at least one of the slots is unused.

8. The semiconductor module of claim 1, wherein the electrical component is a metallization of a circuit carrier or of a semiconductor chip.

9. The semiconductor module of claim 1, wherein the electrical connection between the internal portion and the electrical component is a substance-to-substance connection that is one of a bonding connection, a soldered connection and a connection with electrically conductive glue.

10. The semiconductor module of claim 1, comprising a screw nut, wherein the external portion comprises an opening, wherein the screw nut is arranged between the opening and the pluggable carrier, wherein the screw nut is inserted into a cage of the pluggable carrier, and wherein the screw nut is fixed in the cage against being turned around.

11. A power semiconductor module comprising:
    a housing with a housing frame;
    a connector configured to electrically couple the power semiconductor module; and
    a carrier configured to carry the connector;
    wherein the connector is plugged in a slot of the housing frame; and
    wherein the connector comprises an external portion which is arranged outside the housing, the external portion made of one piece and comprising an internal thread.

12. The power semiconductor module of claim 11, wherein the connector is inserted at least partly into a first depression of the pluggable carrier.

13. The power semiconductor module of claim 11, wherein the carrier is electrically insulating.

14. The power semiconductor module of claim 11, wherein the housing frame comprises a number of slots, each of the slots being designed to receive the carrier.

15. A power semiconductor module comprising:
    a pluggable carrier;
    a lead which is partly inserted into a depression of the pluggable carrier; and
    a housing with a housing frame, the housing frame comprising at least one slot, each of the slots being designed to receive the pluggable carrier;
    wherein the pluggable carrier is plugged in one of the slots;
    wherein the lead comprises an internal portion which is arranged inside the housing and which is electrically coupled to an electric component of the power semiconductor module; and
    wherein the lead comprises an external portion which is arranged outside the housing and which allows for electrically coupling the power semiconductor module, the external portion made of one piece and comprising an internal thread.

16. A method for producing a power semiconductor module comprising:
    providing a pluggable carrier;
    providing a lead which comprises a first section and a second section;
    providing a housing with a housing frame, wherein the housing frame comprises at least one slot which is designed to receive the pluggable carrier;
    providing an electric component;
    equipping the pluggable carrier with the lead;
    arranging the electric component inside the housing frame;
    plugging the pluggable carrier in one of the slots; and
    producing a material locking connection between the second section of the lead and the electric component;
    wherein the first section of the lead comprises an external portion made of one piece and comprising an internal thread.

17. The method of claim 16, wherein equipping the pluggable carrier with the lead is carried out prior to plugging the pluggable carrier in one of the slots.

18. The method of claim 16, wherein plugging the pluggable carrier in one of the slots is carried out prior to arranging the electric component inside the housing frame.

19. The method of claim 16, wherein producing a material locking connection between the second section of the lead and the electric component is realized with an ultrasonic bonding technique.

* * * * *